US012803471B2

(12) United States Patent
Wu et al.

(10) Patent No.: US 12,803,471 B2
(45) Date of Patent: Nov. 17, 2026

(54) PIEZOELECTRIC CERAMIC ACTUATOR AND CONTROL METHODS

(71) Applicant: CHIPSEMI SEMICONDUCTOR (NINGBO) CO., LTD., Ningbo (CN)

(72) Inventors: Yibin Wu, Ningbo (CN); Juiming Ni, Ningbo (CN); Bo Xia, Ningbo (CN); Yaoguo Zhang, Ningbo (CN); Yulin Zhang, Ningbo (CN)

( * ) Notice: Subject to any disclaimer, the term of this patent is extended or adjusted under 35 U.S.C. 154(b) by 687 days.

(21) Appl. No.: 18/475,267

(22) Filed: Sep. 27, 2023

(65) Prior Publication Data

US 2025/0105762 A1 Mar. 27, 2025

(51) Int. Cl.

| | |
|---|---|
| ***H02N 2/14*** | (2006.01) |
| ***H02N 2/00*** | (2006.01) |
| ***H02N 2/18*** | (2006.01) |
| ***H10N 30/80*** | (2023.01) |
| *G06F 3/01* | (2006.01) |

(52) U.S. Cl.

CPC ........... *H02N 2/142* (2013.01); *H02N 2/0075* (2013.01); *H02N 2/181* (2013.01); *H10N 30/802* (2023.02); *G06F 3/016* (2013.01)

(58) Field of Classification Search

CPC ...... H02N 2/142; H02N 2/0075; H02N 2/181; H10N 30/802; G06F 3/016

See application file for complete search history.

(56) References Cited

U.S. PATENT DOCUMENTS

| | | | | |
|---|---|---|---|---|
| 9,069,384 | B2 * | 6/2015 | Koga | G06F 3/0446 |
| 9,996,199 | B2 * | 6/2018 | Park | G06F 3/016 |
| 10,372,214 | B1 * | 8/2019 | Gleeson | G06F 3/0416 |
| 10,691,208 | B2 * | 6/2020 | Toma | G06F 3/016 |
| 10,768,702 | B2 * | 9/2020 | Shimizu | G06F 1/1643 |
| 11,262,853 | B2 * | 3/2022 | Monson | G06F 3/04847 |
| 11,740,697 | B1 * | 8/2023 | Piazza | H10N 30/2042 310/330 |
| 11,829,567 | B2 * | 11/2023 | Liu | G06F 3/0416 |
| 12,035,632 | B2 * | 7/2024 | Khaliq | H10N 30/092 |
| 12,360,601 | B2 * | 7/2025 | Kim | G06F 3/016 |
| 2013/0307803 | A1 * | 11/2013 | Koga | G06F 3/016 345/173 |
| 2017/0357325 | A1 * | 12/2017 | Yang | G06F 3/0443 |
| 2018/0284893 | A1 * | 10/2018 | Shimizu | G06F 1/1643 |
| 2018/0328799 | A1 * | 11/2018 | Park | G01L 5/0038 |
| 2018/0329558 | A1 * | 11/2018 | Park | G02F 1/13338 |
| 2018/0335846 | A1 * | 11/2018 | Toma | G06F 3/016 |
| 2022/0137716 | A1 * | 5/2022 | Monson | G06F 3/0221 345/168 |
| 2023/0341980 | A1 * | 10/2023 | Liu | G06F 3/041 |

(Continued)

*Primary Examiner* — Pedro J Cuevas

(57) ABSTRACT

Embodiments provide an integrated actuator and pressure sensor with closed-loop feedback of capacitance, resulting in improved actuation performance and cost-effective form factor. The disclosed integrated piezoelectric ceramic actuator comprises a capacitance sensing unit, and a piezoelectric ceramic. It operates in either actuation mode or pressure sensing mode. During the actuation operation mode, the integrated actuator generates a first control signal based on the capacitance measured at the capacitance sensing unit. During the pressure sensing operation mode, the working parameters corresponding to pressure applied to the piezoelectric ceramic are determined based on the measured capacitances.

12 Claims, 4 Drawing Sheets

(56) References Cited

U.S. PATENT DOCUMENTS

| | | | | |
|---|---|---|---|---|
| 2024/0256044 | A1 * | 8/2024 | Kim | G06F 3/0416 |
| 2024/0256073 | A1 * | 8/2024 | Oh | G06F 3/016 |
| 2025/0044883 | A1 * | 2/2025 | Lu | G16H 50/20 |
| 2025/0125755 | A1 * | 4/2025 | Wu | H02P 25/034 |

* cited by examiner

PIEZOELECTRIC CERAMIC ACTUATOR AND CONTROL METHODS

FIELD OF THE INVENTION

The present application pertains to the control of actuators in general, and specifically focuses on an integrated piezoelectric ceramic actuator and pressure sensor and the control thereof.

BACKGROUND OF THE INVENTION

An actuator is a component of a machine that is responsible for moving and controlling a mechanism or system, for example, by opening a valve. An actuator requires a control signal and a source of energy. The control signal is relatively low energy and may be electric voltage or current, pneumatic, or hydraulic fluid pressure, or even human power. The source of energy may be an electric current, hydraulic pressure, or pneumatic pressure. When the actuator receives a control signal, it reasons by converting the source of energy into mechanical motion.

However, the existing actuators rarely have closed-loop control, and those that do usually rely on the detection of back electromotive force or the use of Hall sensors to detect changes in magnetic flux to determine the current position of the actuator's rotor. However, not all actuators are driven by magnetic coils, such as piezoelectric ceramic actuators, so not all actuators can detect back electromotive force and magnetic flux.

An electrical actuator is a device that converts electrical energy into mechanical motion. It is widely used in various applications where precise control and positioning are required. Electrical actuators are highly versatile and find applications in various fields, including robotics, industrial automation, automotive systems, aerospace, and many more. Their ability to provide precise and controlled motion makes them valuable components in modern control systems. Electrical actuators offer advantages over other types of actuators, such as pneumatic or hydraulic, because they provide more accurate and controlled movements.

By incorporating a simple capacitance detection and measuring component into existing electrical actuators, the actuator's rotor position can be rapidly and precisely determined by analyzing the capacitance measurements, which reflect its various positions. Feeding this position information back to the control system as a reference allows for faster and finer adjustment to a change in the control signals by the actuator. In turn, it allows more precise and efficient control of the actuator.

Furthermore, with the increasing use of piezoelectric ceramics in various scenarios, besides actuator applications, there are also products on the market that use piezoelectric ceramics as pressure sensors. By integrating the functions of pressure sensor and actuator into one piezoelectric ceramic device, it enables cost-effective applications, but it also brings challenges. One such challenge is interference when the pressure sensor and the actuator are both implemented on one device. For example, when operating in a pressure sensing mode, if the actuator has not completely stopped (e.g., due to tailing or aftershock), it can lead to distortion in the operation of the pressure sensor. On the other hand, when operating in an actuator-mode, the actuator will be affected by any unintended pressure applied, resulting in poor consistency in the vibration effect.

BRIEF SUMMARY OF THE INVENTION

In accordance with the present disclosure, an integrated piezoelectric ceramic actuator and pressure sensor is disclosed. This integrated piezoelectric ceramic actuator operates in either actuation mode or pressure sensing mode and comprises an actuator controller unit, a capacitance sensing unit, an operation mode status storage unit and a piezoelectric ceramic unit.

Also, a method for controlling an integrated piezoelectric ceramic actuator and pressure sensor is provided. The method uses measurements of capacitance as feedback for the control of various functions of the integrated device. The method comprises measuring, at a capacitance sensing unit of the control system, capacitance between a rotor plate attached to a rotor and a stator plate attached to a stator of the piezoelectric ceramic actuator; generating, during actuation operation mode, a first control signal to the actuator based on the measured capacitance; and determining, during pressure sensing operation mode, working parameters corresponding to pressure applied to the piezoelectric ceramic based on the measured capacitances.

Furthermore, when the piezoelectric ceramic is in actuation mode in response to a control signal, the measured capacitances serve as a reference for the actuator's operational consistency, enabling enhanced closed-loop control. Pressure detection begins only when the piezoelectric ceramic is at rest, effectively avoiding interference between pressure detection and actuation.

DETAILED DESCRIPTION OF THE INVENTION

Embodiments of the invention are illustrated here in conjunction with the drawings.

Various details are set forth herein as they relate to certain embodiments. However, the method can also be implemented in ways which are different from those described herein. Modifications can be made to the discussed embodiments by those skilled in the art without departing from the method. Therefore, the method is not limited to embodiments disclosed herein.

Figure 1:
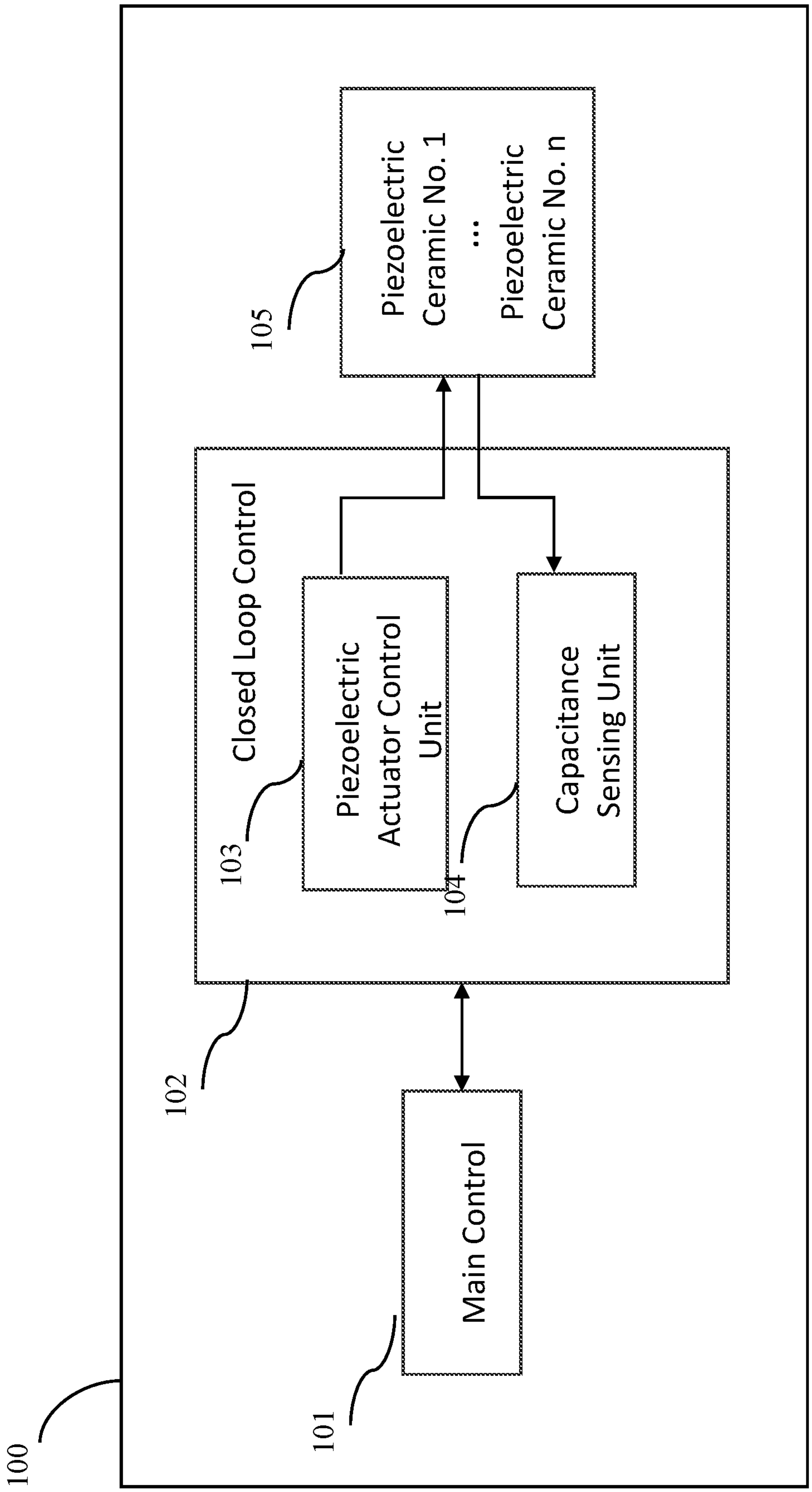
FIG. 1 illustrates at a high level an application system using an integrated actuator and pressure sensor with a closed-loop feedback of capacitance measurement, according to an exemplary embodiment of the present disclosure.

FIG. 1 illustrates at a high level an application system using an integrated actuator and pressure sensor with a closed-loop feedback of capacitance measurement, according to an exemplary embodiment of the present disclosure. In FIG. 1, system 100 comprises a main controller 101, which is operatively connected to a closed-loop controller 102 through an interface (e.g., I2C, USB, SPI, UART, or PWM or other similar type of bus). Closed-loop controller 102 controls one or more integrated piezoelectric ceramic actuators and pressure sensor 105.

In some embodiments, closed-loop controller 102 includes a piezoelectric actuator control unit 103 and a capacitance sensing unit 104. Closed-loop controller 102 can determine the precise location of a rotor of one or more actuators 105. This location information is then fed to main controller 101. Depending on the specifics of an application, the main controller 101 then sends the appropriate control signals to an actuator control unit 103, which in turn controls the movement of an integrated piezoelectric actuator and pressure sensor 105, including but not limited to modifications of vibration and braking of the actuator 105.

In FIG. 1, the main controller 101 may be for any equipment or device, such as a mobile phone, a computer, a headphone, an interface in a car.

In FIG. 1, closed-loop controller 102 has the function of driving the actuators 105 during actuation operation mode, detecting pressure applied to the piezoelectric ceramics during pressure sensing mode, and performing the capacitance detection and measurement in either operation mode.

According to some embodiments, closed-loop controller 102 may be implemented in a single chip. In other embodiments, closed-loop controller 102 may be an integrated system consisting of two or more chips.

In FIG. 1, integrated piezoelectric actuator and pressure sensors 105 (No. 1 . . . . No. n) are devices capable of switching between actuation mode and pressure sensing mode based on the control signals generated by controller 102 according to capacitance measured by capacitance sensing unit 104.

According to some embodiments of the present disclosure, the piezoelectric ceramics can also be used as a pressure sensor in addition to being an actuator (e.g., 105) as illustrated in FIG. 1. Here, closed-loop controller 102 for piezoelectric ceramic actuator 105 utilizes the capacitance sensing unit 104 to monitor the operational status of the piezoelectric ceramic actuator and the intensity of the pressure exerted on its surface, depending on the operation mode. This data is then sent as feedback to the main controller 101. Depending on the requirements of the application, the main controller 101, through the piezoelectric ceramic actuator control unit 103, modulates vibrations of actuator 105. This modulation encompasses various functions including, but not limited to, vibration effect adjustment and vibration braking.

The theoretical basis of the present invention is briefly summarized below. The relationship of the capacitance and the distance between the two electrodes for a given piezo ceramic can be mathematically summarized by the following formula.

$$C = \frac{\varepsilon}{4\pi kd} S \tag{1}$$

Where ε is the dielectric constant of the medium, k is an electrostatic constant, S is the overlapping area between two electrode plates, d is the vertical distance between the two electrode plates. The dielectric constant ε is an inherent physical quantity of ceramics. For the same ceramic, its dielectric constant is unchanged. These constant values can be predetermined during calibration of an integrated piezoelectric actuator and pressure sensor and stored in Main Controller according to some embodiments of the present disclosure.

When the piezoelectric ceramic is subjected to external force, it will cause deformation, thereby changing the distance d between the electrode plates. As a result, the capacitance will change. The greater the pressure, the greater the deformation, and the greater the change in capacitance. Thus, during actuation or pressure sensing operations of the integrated piezoelectric ceramic actuator and pressure sensor, the capacitance can be determined by calculation using the prestored constants and the actual measurements of d according to formula (1), in addition to be measured.

Figure 2:
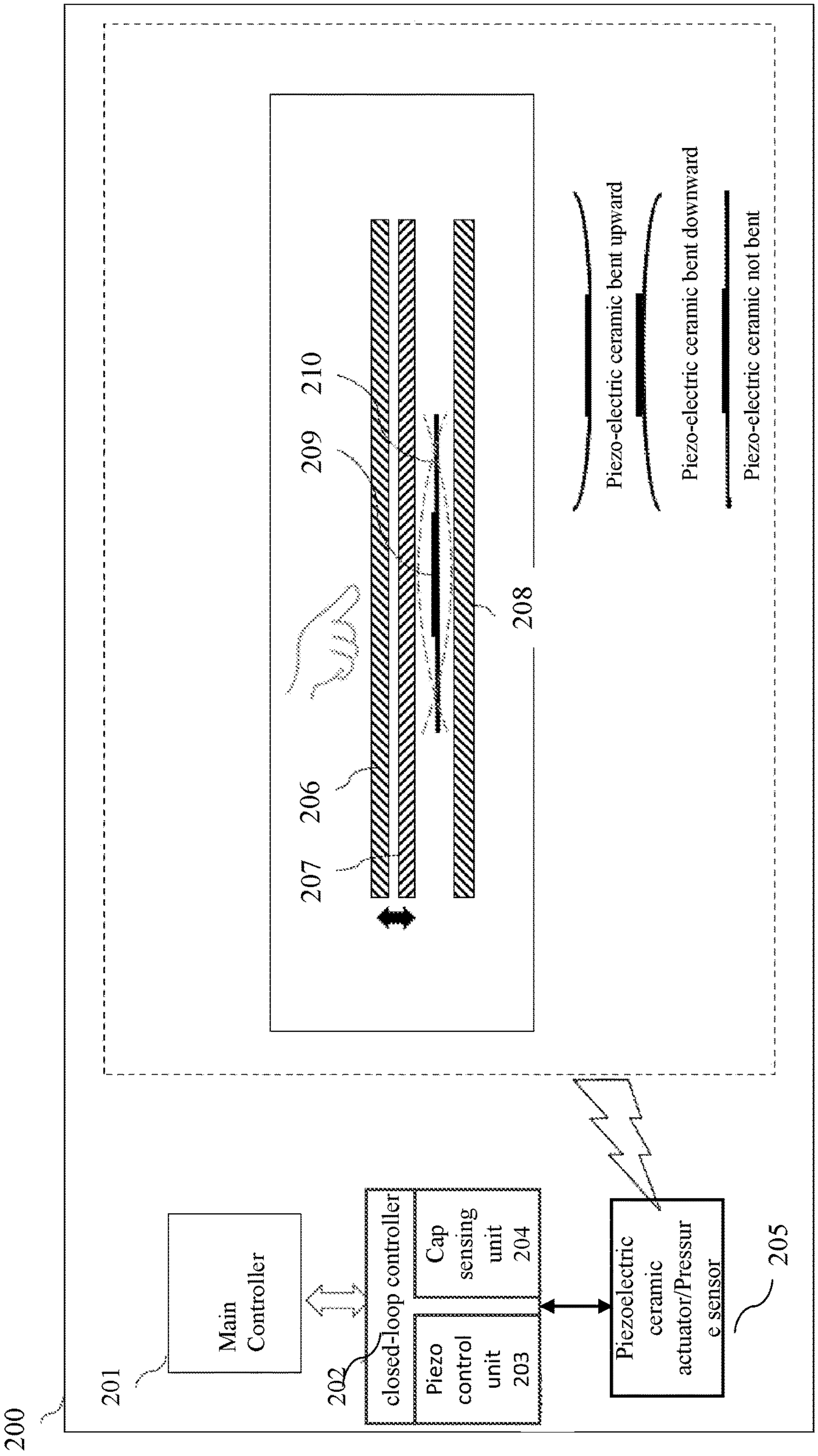
FIG. 2 illustrates another exemplary application system using a piezo ceramic actuator according to some embodiments of the present disclosure.

FIG. 2 illustrates an exemplary application system 200 using an integrated piezoelectric actuator and pressure sensor, according to some embodiments of the present disclosure.

Here, 200 is a piezoelectric ceramic vibration feedback touchpad according to some embodiments of the present disclosure. System 200 includes: main controller 201, closed-loop controller 202, piezoelectric ceramic control unit 203, capacitance sensing unit 204, integrated piezoelectric ceramic actuator and pressure sensor 205, and cover plate 206 and a support plate 208.

According to some embodiments, 201/202/203/204 are all implemented on a circuit board 207. Integrated piezoelectric ceramic actuator and pressure sensor 205 includes electrodes 209 and 210. Electrodes 209 and 210 are connected to piezoelectric ceramic control unit 203 and the capacitance sensing unit 204. The entire system is built on support bracket 208.

When pressure is applied to (e.g., a finger presses on) cover plate 206, the main controller 201 obtains the pressure value of piezoelectric ceramic 205 acting as a pressure sensor through capacitance sensing unit 204. When the pressure reaches a certain threshold, the main controller 201, based on the pressure magnitude, applies different voltages through piezoelectric ceramic control unit 203 to drive the piezoelectric ceramic 205 as an actuator to vibrate.

When piezoelectric ceramic 205 is used as an actuator, the capacitance variation can be detected by the capacitance sensing unit 204. The capacitance changes or variation data are then utilized to determine the current working state of the actuator. This working state is then compared with the expected state, and if it does not meet expectation, the main controller 201 adjusts the working parameters of the piezoelectric ceramic drive 203 to make working state meet expectations, completing a touch and vibration feedback closed-loop control process. Examples of working state include vibration amplitude of the ceramic, the acceleration of the vibration, the initiating time and braking time. Also, according to some embodiments, working parameters may include the voltage of the control signal, or the frequency of the control signal generated by the piezoelectric control unit 203.

According to some embodiments, the main controller 201 may implement a control strategy that utilizes a proportional-integral-derivative (PID) controller to regulate the behavior of the piezoelectric actuator. A PID controller is a feedback control loop mechanism commonly used in various engineering applications to maintain a desired output or setpoint by adjusting a control input. In this case, the change in capacitance between the rotor and stator can be used as one of the control inputs.

As the actuator's position changes due to pressure changes, the distance between the rotor and stator changes, leading to a variation in capacitance. This change in capacitance can be measured and converted into a proportional signal representing the actuator's position.

The capacitance measurement serves as a feedback signal to the PID controller. Instead of relying solely on external position sensors, the capacitance measurement directly provides information about the actuator's position. This can potentially reduce the complexity and cost of the control system.

The change in capacitance can be directly related to the displacement of the actuator. The proportional (P) term of the PID controller can utilize this capacitance change to generate a control effort that is proportional to the position error. As the actuator deviates from the desired position, the PID controller can calculate a proportional correction based on the capacitance error.

The integral (I) and derivative (D) terms can also incorporate the capacitance measurement. The integral term can help eliminate any steady-state error due to capacitance-related changes over time. The derivative term can take into account the rate of change of capacitance, helping to prevent rapid changes in position that might be caused by sudden changes in capacitance.

In some cases, the capacitance change might not be linear or constant due to environmental factors or mechanical variations. Advanced control strategies, such as adaptive control, can use capacitance measurement to adjust the PID controller's parameters in real-time, enhancing the actuator's performance under varying conditions.

It is noted that in the above description, by detecting the pressure only when the piezoelectric ceramic is stationary, it can avoid the interference between the pressure detection and the actuation, and at the same time, the pressure size provides a reference for the consistency of the actuator work, and realizes closed-loop control.

Figure 3:
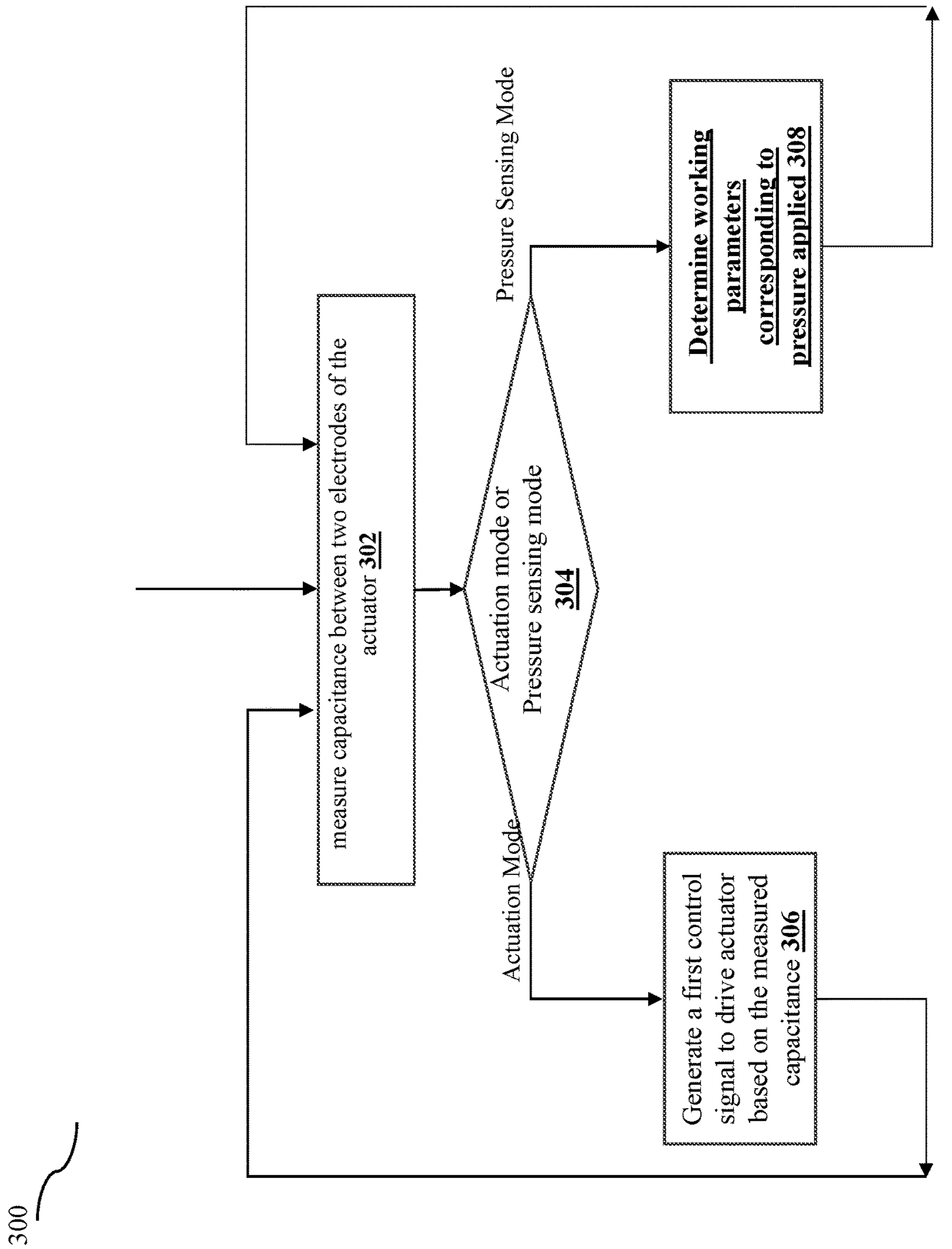
FIG. 3 illustrates a method for controlling the integrated piezoelectric ceramic actuator and pressure sensor based on capacitance feedback according to some embodiments of the present disclosure.

FIG. 3 illustrates a method for controlling an integrated piezoelectric ceramic actuator and pressure sensor based on capacitance feedback according to some embodiments of the present disclosure.

The operations of method 300 presented below are intended to be illustrative. In some embodiments, method 300 may be accomplished with one or more additional operations not described and/or without one or more of the operations discussed. Additionally, the order in which the operations of method 300 are illustrated in FIG. 3 and described below is not intended to be limiting.

In step 302, capacitances between two electrodes of the piezoelectric ceramic actuator are measured at a predetermined sampling rate. For more detailed capacitance sensing circuits examples. Please refer to FIGS. 3 and 4 and their corresponding descriptions of the U.S. Pat. No. 11,671,709, which is incorporated by reference herein.

In step 304, operation mode of the integrated actuator and pressure sensor is checked to see whether the integrated device is operating in actuation mode or pressure sensing mode. In certain embodiments, this may be implemented through a single bit storage unit that can be toggled. For example, if the operation is in actuation mode, this operation mode status bit is set to 1; if the operation is in pressure sensing mode, the operation mode status bit is set to 0. If the operation mode status bit is 1, the operation proceeds to step 306, otherwise, the operation goes to step 308.

In step 306, the actuator controller (e.g., 202 in FIG. 2) generates a first control signal to drive actuator based on measurements of the capacitance obtained and stored during step 302. According to some embodiments, the first control signal may last for a predetermined time. The operation returns to step 302.

Optionally, in step 306, if the first control signal is completed, the operation mode status is switched to pressure sensing mode. If the first control signal is not completed, the operation mode status is unchanged.

In step 308, while the integrated device is operating in pressure sensing mode, working parameters corresponding to pressure applied to the piezoelectric ceramic are determined based on capacitance measured. Examples of working parameters may include voltage, amplitude and frequency of a signal. These working parameters are sent to actuator controller (or alternatively main controller) to determine a second control signal that would generate a vibration corresponding to the pressure applied later-after the operation mode is switched from pressure sensing mode to actuation mode.

Figure 4:
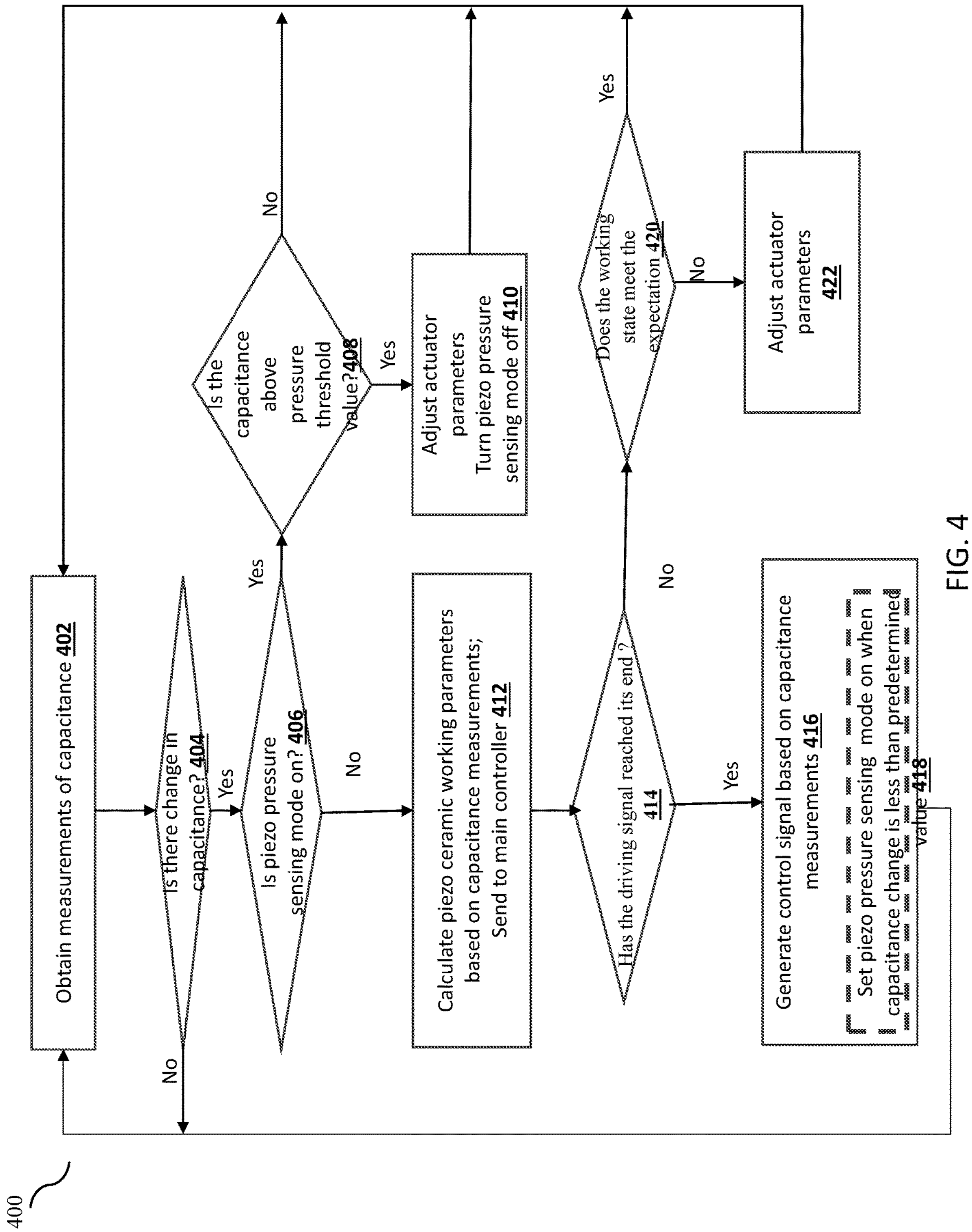
FIG. 4 illustrates another method for controlling the integrated piezoelectric ceramic actuator and pressure sensor based on capacitance feedback according to some embodiments of the present disclosure.

FIG. 4 illustrates another method for controlling a piezoelectric ceramic actuator through capacitance closed-loop feedback control (See e.g., FIG. 2). In addition, this disclosed system also has the additional functionality of pressure sensing through leveraging the pressure sensing capability of the piezo ceramic. Method 400 described below serves as an illustrative example of the closed-loop control process for vibrations generated by a click or pressing action on a piezoelectric ceramic touchpad such as the one described above in FIG. 2.

In step 402, the capacitance between rotor plate/electrode (e.g., 209 of FIG. 2) and the stator plate/electrode (e.g., 210 of FIG. 2) is obtained by a capacitance sensing unit (e.g., 204 of FIG. 2).

In step 404, two consecutively measured capacitance are compared to determine whether there is change in capacitance. According to some embodiments, a predetermined threshold value may be used to determine whether there is change. If the difference is below the predetermined capacitance change threshold value, then it is determined that there is no change, and the process returns to step 402. Otherwise, the process goes to the next step 406.

In step 406, because the application system may work in either actuation mode or pressure sensing move, the operation mode is checked. In some embodiments, this can be simply implemented as a single bit register with 1 indicating actuation mode and 0 indicating a pressure sensing mode. If it is determined that the current operation is pressure sensing, then the process goes to step 408, otherwise, it goes to step 412.

In step 408, in this pressure sensing operation mode, the capacitance obtained in step 402 is checked against a predetermined capacitance threshold value. This allows the main controller to determine whether the pressure sensed is above or below a certain pressure threshold value (corresponding to the predetermined capacitance threshold value.) If it is lower than this pressure threshold value, the process goes back to step 402. Otherwise, the process goes to step 410.

In step 410, the main controller determines the proper vibration parameters or adjustments based on the changes in the capacitance measures obtained in step 402. The main controller sends these working parameters to the actuator controller (e.g., 203 of FIG. 2) to cause the proper vibration of piezoelectric ceramic actuator. For example, the proper vibration may be generated as a haptic response to pressure applied to the cover plate by a user (e.g., 206 of FIG. 2). Also, at the end of step 410, the operation mode is switched from pressure sensing mode to actuation mode to accomplish the desired vibration and the operation returns to step 402.

In step 412, in actuation mode, the working parameters of the actuator are determined based on the capacitance measurements obtained in step 402. Examples of working parameters include vibration amplitude of piezoelectric ceramic of the piezoelectric ceramic actuator, voltage of the actuator control signal, the frequency of the actuator control signal, various predetermined threshold values, capacitance measured when the actuator is at its null position; and duration of the actuator control signal. The operation then goes to step 414.

In step 414, the main controller determines whether the control signal driving the actuator has reached its end based on the working parameters received. If yes, the operation goes to step 416, otherwise, it goes to step 420.

In step 416, the changes in the capacitance of the piezoelectric ceramic are compared with the static capacitance of the piezoelectric ceramic (when piezoelectric ceramic has no pressure applied) and a control signal is generated to drive the actuator. For example, an opposite voltage is applied to achieve actuator braking. In this case, if the ceramic is determined to be bent upward, a voltage $V_{down}$ is applied to cause it to return to neutral position. If the ceramic is determined to be bent downward, a voltage of opposite polarity $V_{up}$ is applied to cause it to return to neutral position. The operation continues to step 418.

In step 418, when the absolute value of the capacitance change in the piezoelectric ceramic is less than the braking threshold, the braking operation is deemed to be complete, and the operation mode the piezoelectric ceramic is set back to pressure sensing mode to get ready for the next cycle of operation (e.g., next user input through tapping/touching/pressing the ceramic.). The operation returns to step 402.

In step 420, when the actuation control signal has not reached its end, the working state of the actuator is checked to determine whether they meet expectation. If not, the operation goes to step 422, otherwise, it returns to step 402. Examples of working state include vibration amplitude of the ceramic, the acceleration of the vibration, the initiating time and braking time.

In step 422, the actuator working parameters are adjusted based on the feedback of the actuator. For example, the working parameters may include control signal voltage or frequency. After the adjustments are made, the operation returns to step 402.

Though the method for controlling an actuator braking is disclosed by way of specific embodiments as described above, those embodiments are not intended to limit the present method. Based on the methods and the technical aspects disclosed herein, variations and changes may be made to the presented embodiments by those of skill in the art without departing from the spirit and the scope of the present method. For example, in the above description of step 404, the main controller determines whether the control signal driving the actuator has reached its end based on the working parameters received. However, the determining whether the control signal driving the actuator has reached its end can instead be implemented in the closed-loop controller 202.

Also, while the embodiment described above specifically pertains to the braking function of an actuator, it is evident to those skilled in the art that the core principles of this invention can be analogously applied to various other functions associated with controlling an actuator. For instance, the invention's mechanisms can be adapted to modulate the speed of the actuator, to reverse its direction, or to introduce variable torque control. Hence, a person skilled in the art would appreciate the broader applicability of the invention beyond mere braking, embracing a spectrum of actuator control functionalities.

What is claimed is:

1. A method for controlling a control system employing a piezoelectric ceramic actuator with pressure sensing capability, the method comprising:

measuring, at a capacitance sensing unit of the control system, capacitance between a rotor plate attached to a rotor and a stator plate attached to a stator of the piezoelectric ceramic actuator;

generating, during actuation operation mode, a first control signal to the actuator based on the measured capacitance; and determining, during pressure sensing operation mode, working parameters corresponding to pressure applied to the piezoelectric ceramic based on the measured capacitances.

2. The method of claim 1, further comprising:

determining whether the rotor of the actuator is in null position based on the measured capacitance; and switching from actuation operation mode to pressure sensing mode when actuation is determined to be complete.

3. The method of claim 1, further comprising:

generating, during pressure sensing operation mode, a second control signal corresponding to the determined working parameters to operate the actuator during actuation mode.

4. The method of claim 1, further comprising:

determining whether the piezoelectric actuator is operating in pressure sensing mode or actuation mode;

if it is determined to be in pressure sensing operation mode, (i) comparing the measured capacitances to a predetermined pressure sensing capacitance threshold value to determine whether there is pressure applied to the piezoelectric actuator; (ii) if pressure has been applied, determining working parameters based on the measured capacitances for an actuator controller to generate a control signal to the actuator to operate in actuation mode later; (iii) switching operation mode to actuation mode;

if it is determined to be in actuation mode, (i) generating the control signal based on the working parameters; (ii) adjusting the working parameters based on the measured capacitances; (iii) if the control signal has come an end, adjusting the working parameters to cause braking of the actuator and switching operation mode to pressure sensing mode; and repeating above steps for a predetermined time interval.

5. The method of claim 1, wherein the working parameters comprises vibration amplitude of piezoelectric ceramic of the piezoelectric ceramic actuator, voltage of the actuator control signal, the frequency of the actuator control signal, various predetermined threshold values, capacitance measured when the actuator is at its null position; and duration of the actuator control signal.

6. The method of claim 1, wherein the first control signal is a braking signal.

7. The method of claim 1, further comprising determining moving direction of the rotor based on the capacitance measurements.

8. The method of claim 1, wherein the actuation mode and pressure sensing mode are toggled based on a status of a single-bit memory.

9. The method of claim 1, further comprising measuring capacitance between the rotor plate and an electrically conductive layer of the printed circuit board serving as the stator plate.

10. A piezoelectric ceramic actuator with pressure sensing capability comprising an actuator controller unit, a capacitance sensing unit, an operation mode status storage unit, and a piezoelectric ceramic unit, wherein the actuator controller unit is configured to generate a control signal to control the piezoelectric ceramic unit;

the capacitance sensing unit is configured to measure capacitance between a rotor and a stator of the piezoelectric ceramic unit;

the operation mode status storage unit is configured to store operation mode of the piezoelectric ceramic unit; and the piezoelectric ceramic unit is configured to operate in either actuation mode or pressure sensing mode.

11. The piezoelectric ceramic actuator of claim 10, wherein the operation mode status storage unit is a one-bit register indicating whether the piezoelectric ceramic unit is operating as a pressure sensor or an actuator.

12. The piezoelectric ceramic actuator of claim 10, wherein the piezoelectric ceramic unit consists of:

a support base plate;

a circuit board;

a cover plate located above the circuit board; and two electrodes, both electrodes connected to the actuator controller unit and the capacitance sensing unit.

* * * * *